(12) United States Patent
Dossetto

(10) Patent No.: US 6,617,672 B1
(45) Date of Patent: Sep. 9, 2003

(54) METHOD FOR PRODUCING CONTACT CHIP CARDS WITH A LOW-COST DIELECTRIC

(75) Inventor: Lucile Dossetto, La Ciotat (FR)

(73) Assignee: Gemplus, Gemenos (FR)

( * ) Notice: Subject to any disclaimer, the term of this patent is extended or adjusted under 35 U.S.C. 154(b) by 0 days.

(21) Appl. No.: 09/979,709

(22) PCT Filed: May 11, 2000

(86) PCT No.: PCT/FR00/01265
§ 371 (c)(1),
(2), (4) Date: Nov. 26, 2001

(87) PCT Pub. No.: WO00/72253
PCT Pub. Date: Nov. 30, 2000

(30) Foreign Application Priority Data
May 25, 1999 (FR) ............................................. 99 06584

(51) Int. Cl.⁷ ..................... H01L 23/495; H01L 23/02; H01L 21/44; H01L 21/48; H01L 21/50

(52) U.S. Cl. ...................... 257/668; 257/676; 257/679; 438/118; 438/123; 438/125

(58) Field of Search ................................. 257/668, 676, 257/6, 79; 438/118, 123, 125, FOR 369, FOR 377, FOR 380

(56) References Cited

U.S. PATENT DOCUMENTS

| | | | | |
|---|---|---|---|---|
| 4,222,516 A | * | 9/1980 | Badet et al. ................. 235/492 |
| 4,550,248 A | * | 10/1985 | Hoppe et al. ................ 235/492 |
| 4,879,153 A | | 11/1989 | Ohashi et al. | |

FOREIGN PATENT DOCUMENTS

| | | |
|---|---|---|
| EP | 0 246 744 A2 | 11/1987 |
| EP | 0 688 050 A1 | 12/1995 |
| EP | 0 774 779 A1 | 5/1997 |
| EP | 0813 166 A2 | 12/1997 |
| FR | A-2 632-100 | 12/1927 |
| WO | WO 96/34361 | 10/1996 |

* cited by examiner

*Primary Examiner*—David E Graybill
(74) *Attorney, Agent, or Firm*—Burns, Doane, Swecker & Mathis, L.L.P.

(57) ABSTRACT

In a method for manufacturing a contact chip card, a dielectric support film is provided in the form of a strip. A metal grid which defines contact pads on the upper surface thereof and connection pads on the lower surface thereof is created. The dielectric support film is irremovably fixed on the upper surface of the metal grid in such a way that the contact pads of the grid are free. The chip is glued and connected to the connection pads of the grid, and the metal grid is cut to obtain a micromodule to be inserted in the cavity of a body of the card. In one particular embodiment, the grid is arched in order to encase the thickness of the dielectric.

21 Claims, 3 Drawing Sheets

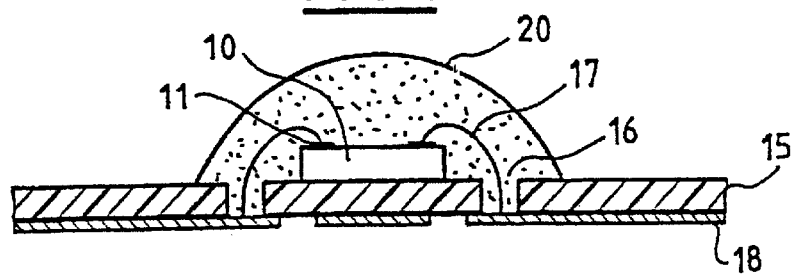
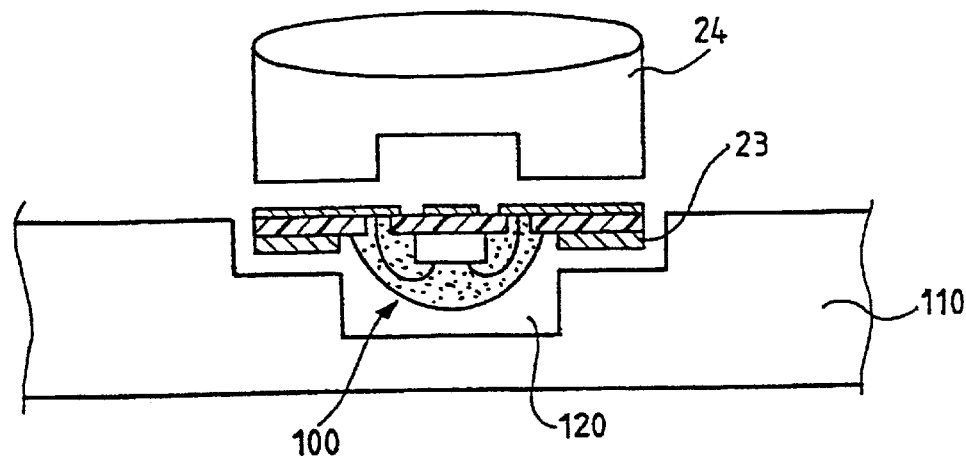
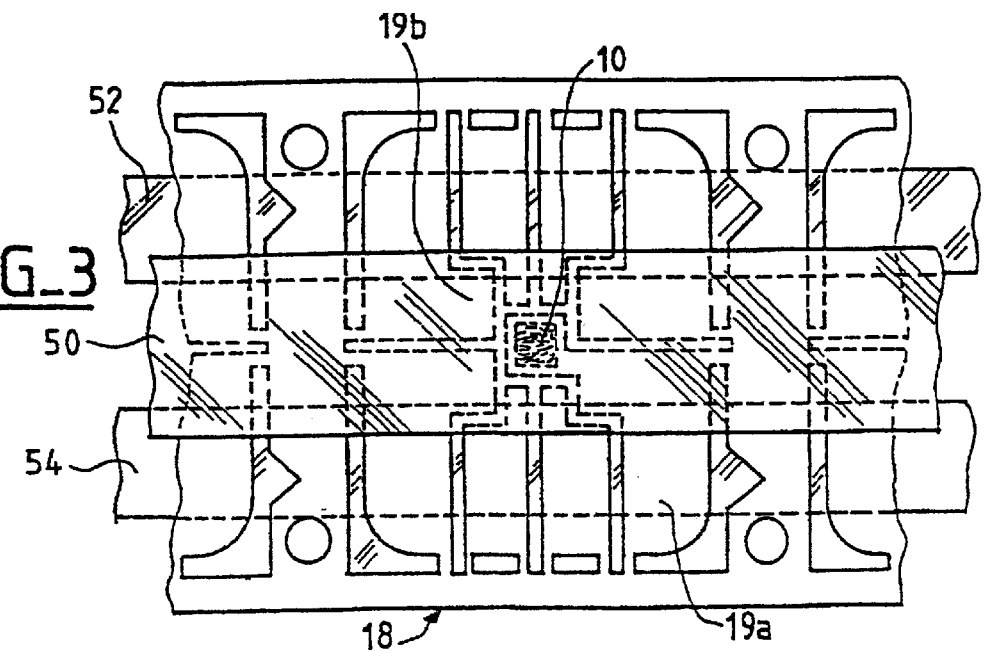

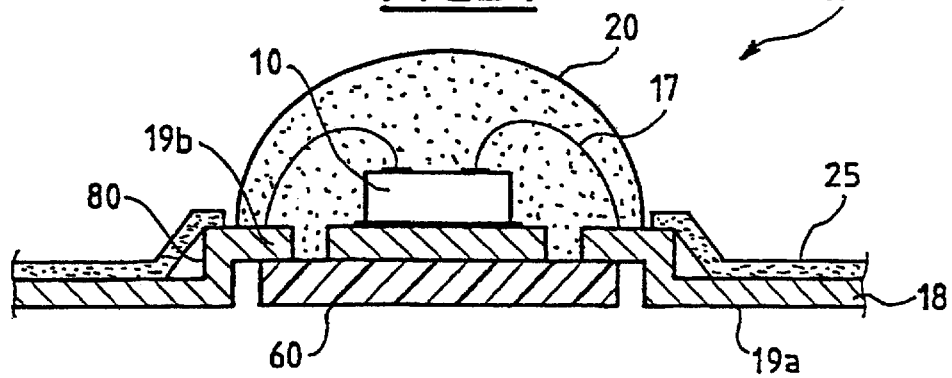
FIG_4
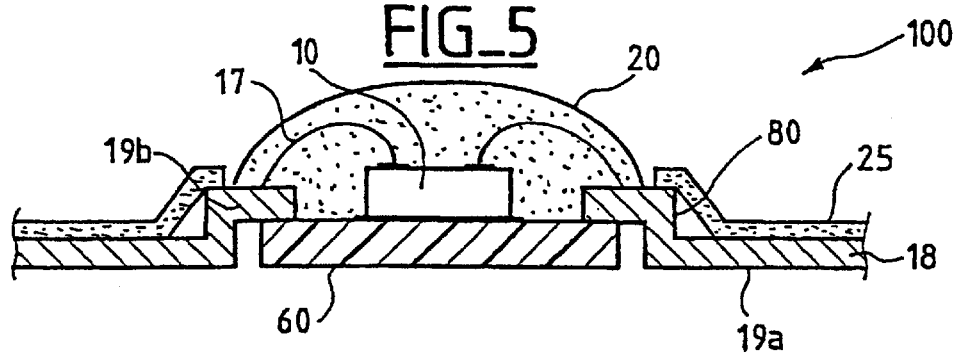
FIG_5
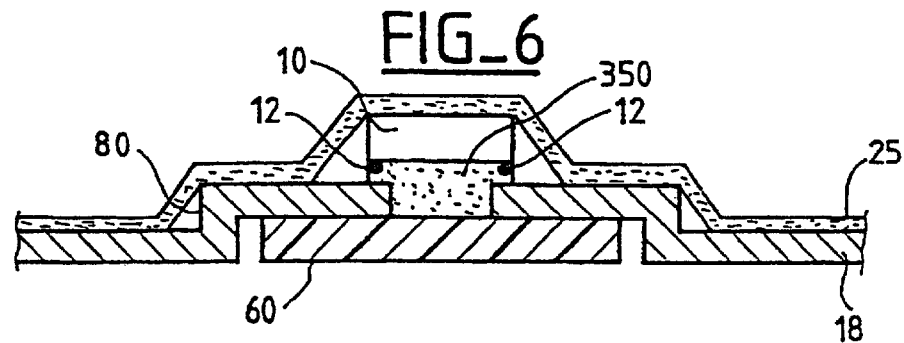
FIG_6
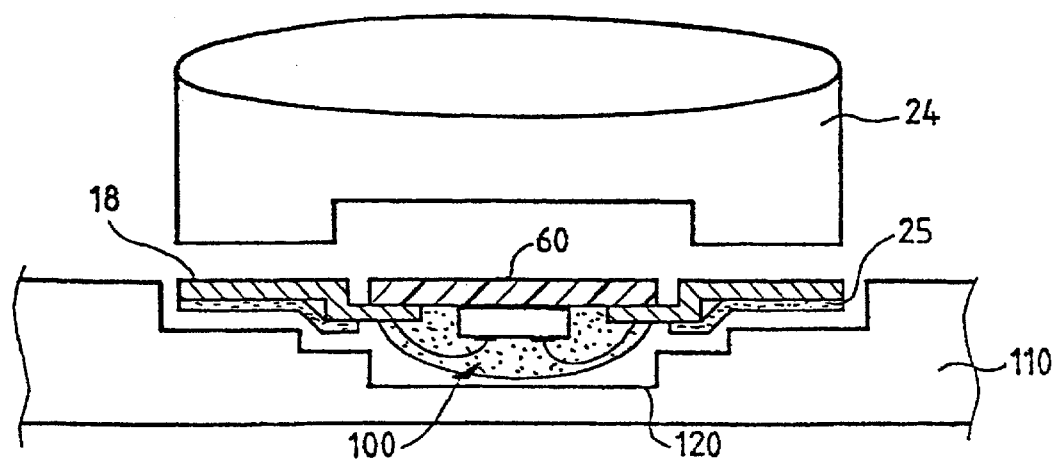
FIG_7

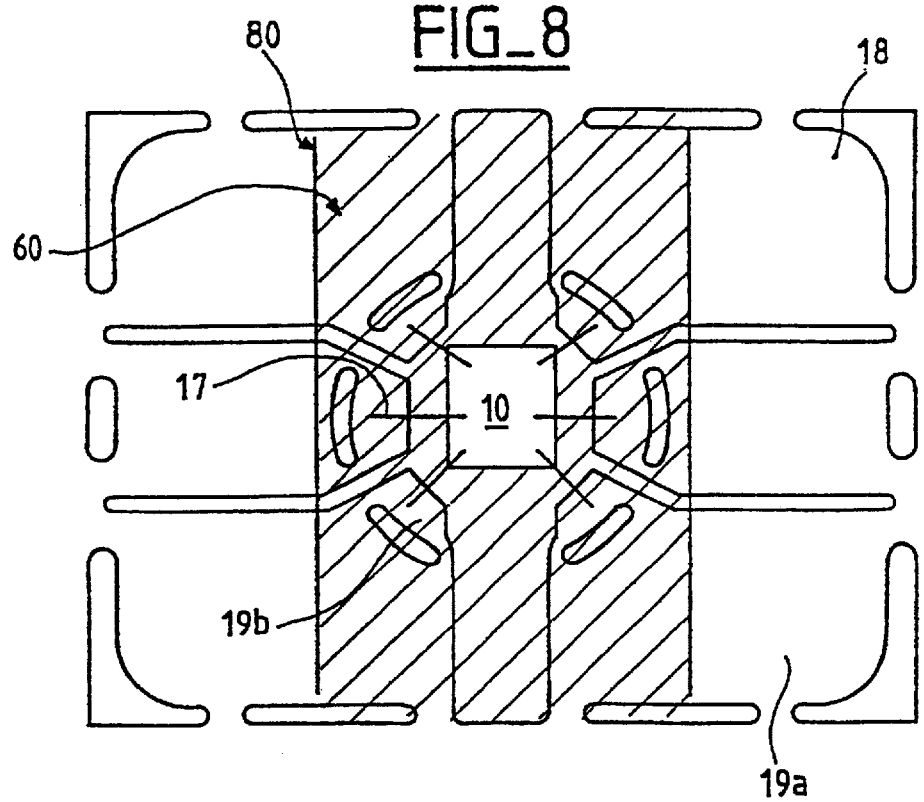
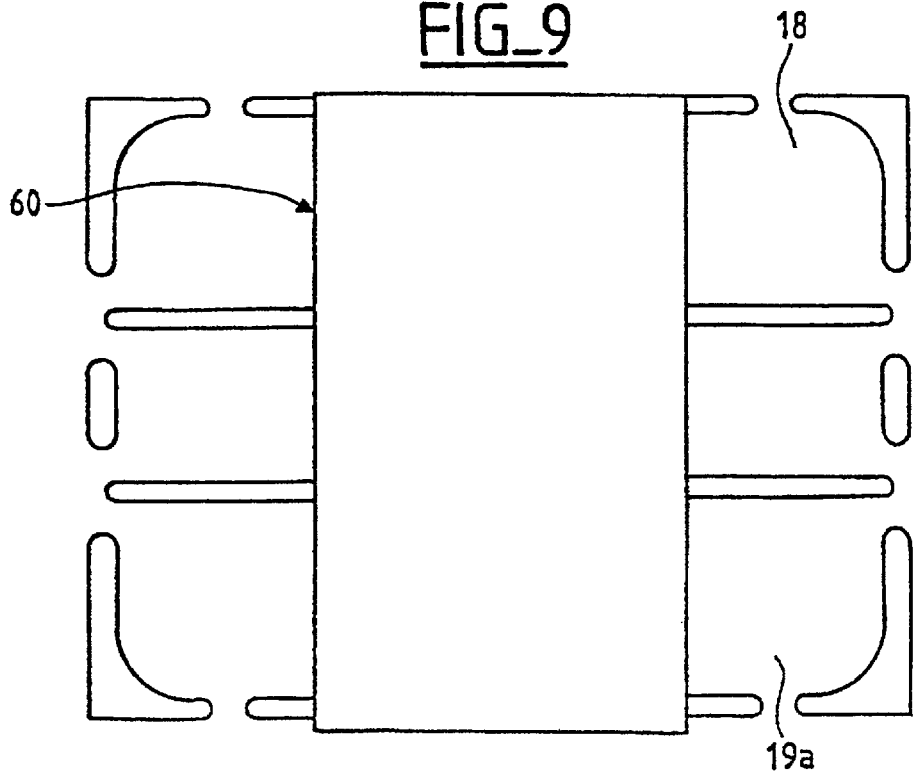

METHOD FOR PRODUCING CONTACT CHIP CARDS WITH A LOW-COST DIELECTRIC

This disclosure is based upon French Application No. 99/06584, filed on May 25, 1999 and International Application No. PCT/FR00/01265, filed May 11, 2000, which was published on Nov. 30, 2000 in a language other than English, the contents of which are incorporated herein by reference.

BACKGROUND OF THE INVENTION

The present invention relates to the manufacture of portable electronic devices, including at least one integrated circuit chip embedded in a support and electrically connected to interface elements consisting of a connection terminal block.

These portable electronic devices constitute for example contact smart cards.

Smart cards are intended for performing various operations such as, for example, banking or telephone communication operations, various identification operations, or operations of the cash dispensing type.

Contact cards have metallisations flush with the surface of the card, disposed at a precise point on the card body, defined by the usual standard ISO 7816. These metallisations are intended to come into contact with the reading head of a reader with a view to electrical transmission of data.

As currently produced, smart cards are thin portable elements with standard dimensions. ISO 7810 corresponds to a card with a standard format 85 mm long, 54 mm wide and 0.76 mm thick.

The majority of smart card manufacturing processes are based on the assembly of the integrated circuit chip in a subassembly known as a micromodule which is inset, that is to say placed in a cavity provided in a card body, using techniques known to experts.

A conventional method is illustrated in FIG. 1. Such a method consists in gluing an integrated circuit chip 10 by disposing its active face with its contact pads 11 upwards, and gluing its opposite face to a dielectric support sheet 15. The dielectric sheet 15 is itself disposed on a contact grid 18 such as a nickel- and gold-plated copper metallic plate for example. Connection wells 16 are formed in the dielectric sheet 15 in order to enable connection wires 17 to connect the contact pads 11 of the chip 10 to the connection areas on the grid 18.

According to certain variants, it is possible to glue the chip 10, with its active face upwards, directly on the contact grid 18, and then to connect it by hard wiring 17.

In such a variant, the grid 18 is deposited on a dielectric support 15 and the contact and connection areas on the said grid are defined by chemical etching or any other known means.

A protection or encapsulation step then protects the chip 10 and the soldered connection wires 17. Use is generally made of a technique known as "glob top" in English terminology, which designates the coating of the chip from above. This technique consists in pouring a drop of resin 20, based on epoxy for example, thermosetting or cross-linking under ultraviolet, onto the chip 10 and its connection wires 17.

The dielectric support 15 with the chip 10 glued and protected by the resin 20, is cut in order to constitute a micromodule 100, which is inset in the cavity of a previously decorated card body. This insetting operation can be effected by depositing a liquid glue in the cavity of the card body before adding the micromodule.

FIG. 2 illustrates another insetting technique. The card body 110 is produced according to a conventional method, for example, by the injection of plastics material into a mould. The cavity 120 is obtained either by milling the card body, or by injection at the time of manufacture of the card body in an adapted mould.

A thermoactivatable adhesive film 23 is deposited by lamination on the dielectric film 15 preferentially before the cutting of the micromodule 100. The latter is inset in the cavity 120 in the card body 110 and glued by reactivating the thermoactivable adhesive 23 by hot pressing by means of a press 24 whose shape is adapted to that of the cavity 120.

The known technologies of manufacturing smart cards have many drawbacks.

In particular, the standard technology uses expensive techniques and a high-quality dielectric. The dielectric used is generally made from an epoxy glass composite or from Kapton.

This is because the dielectric chosen must have properties of good resistance to temperature in order to be compatible with the insetting techniques described previously.

In addition, the geometric definition of the different contact and connection areas is generally obtained by chemical etching of the metallic grid deposited uniformly on the dielectric support. However, chemical etching is an expensive operation.

The French patent No 2 632 100 describes another method for manufacturing a smart card.

Such a method is illustrated in FIG. 3 and uses a conductive frame (lead frame in English) to which the integrated circuit chip is directly fixed. This lead frame is obtained by cropping or punching from a continuous metallic strip, which makes it possible to dispense with the chemical etching operation.

Contact areas 19a and connection areas 19b have been defined in each lead frame of the metallic strip 18.

The method described in this patent consists essentially in laminating a first insulating strip 50 on the external face of the metallic grid 18, which leaves the contact areas 19a free, and laminating two other insulating strips 52 and 54 on the internal face of the grid 18, which surround the connection areas 19b of the chip 10. The chip is then fixed to the internal face of the grid by hard wiring or according to a conventional method of a turned-over chip ("flip chip" in English terminology).

This technique makes it necessary to laminate three strips of insulating material on the metallic grid, which requires great precision in indexing.

In addition, the external insulating strip 50 is fixed temporarily, and is in fact intended to be removed after the use of the card.

In addition, the protection of the chip 10 and of its connection wires 17 by coating in a resin is not easy due to the two insulating strips 52 and 54 situated on the internal face of the grid 11 on each side of the chip 10.

Finally, this technique does not afford a complete solution to the problem of the choice of the dielectric since the latter must always have thermal properties compatible with the conventional insetting techniques.

SUMMARY OF THE INVENTION

The aim of the present invention is to mitigate the drawbacks of the prior art.

To this end, the present invention proposes a method for manufacturing a smart card making it possible to use inexpensive materials and in particular a low-quality dielectric.

In particular, the present invention proposes to fix a dielectric support film not to the bottom face of the grid but to the top face of the grid, the dielectric film having the shape of a strip with a width such that it can be disposed between the ISO contact areas of the metallic grid.

The object of the present invention is more particularly a method for manufacturing a contact smart card, characterised in that it includes the following steps:

supplying a dielectric support film in strip form;

producing a metallic grid defining contact areas on its top face, and connection areas on its bottom face;

removable fixing of the dielectric support film to the top face of the metallic grid so as to leave the contact areas of the grid free;

gluing the chip and connection to the connection areas of the grid;

cutting the metallic grid in order to obtain a micromodule and attaching the said micromodule in the cavity of a card body.

According to a particular embodiment of the invention, the metallic grid is arched, the dielectric strip being fixed in the arch so as to place the said strip flush with the contact areas of the grid whilst leaving the latter free.

According to one particularity, the dielectric strip has an adhesive face, not peelable at room temperature, intended to be fixed integrally to the metallic grid.

According to one embodiment, the dielectric strip is fixed to the metallic grid by lamination.

According to a variant embodiment, the dielectric strip consists of a polyethylene terephthalate (PET).

According to a variant embodiment, the dielectric strip consists of an acrylonitrile butadiene styrene (ABS)

According to a variant embodiment, the dielectric strip consists of paper.

According to a variant embodiment, the dielectric strip consists of a polyvinyl chloride (PVC).

According to a first embodiment, the chip being connected to the metallic grid by hard wiring, a reactivatable adhesive film is laminated on the metallic grid, the said adhesive being perforated in order to leave the chip and its connection wires free.

According to a second embodiment, the chip being connected to the metallic grid by flipping over, a reactivatable adhesive film is laminated on the metallic grid and covers the rear face of the chip.

According to a preferential embodiment, the micromodule is fitted in the cavity of the card body by activation of the adhesive.

The present invention also relates to an integrated circuit electronic module having a dielectric support film fixed integrally to a metallic grid defining contact areas on its top face, characterised in that the dielectric support film extends partially over the top face of the grid whilst leaving the contact areas free.

According to one characteristic, the dielectric support film is a strip disposed on a middle zone between the zones of the contact areas.

Preferentially, the metallic grid has an arch able to receive, at least partially, the thickness of the dielectric support film.

According to one particular embodiment, the integrated circuit electronic module has an integrated circuit chip attached to a dielectric support strip and connected to a communication interface, characterised in that the communication interface consists of a metallic grid arched so as to encase the thickness of the dielectric strip, the said strip being fixed to the top face of the metallic grid and leaving the contact areas of the grid free..

The present invention applies to any support with an electronic chip, such as a card, comprising an electronic module according to the invention.

The present invention makes it possible to obtain, with a simple and economical method, a thin micromodule, having good resistance to humidity and with a completely flat ISO connection terminal block.

In particular, the method according to the invention makes it possible to use a low-quality dielectric since the latter does not require, the conventional properties of compatibility with the usual insetting techniques.

This is because, and this will emerge more precisely below, the dielectric does not cover the contact areas of the metallic grid. However, during insetting, it is these areas which are pressed or glued with a glue of the cyanoacrylate type.

In addition, the manufacturing method according to the invention has the advantage of allowing the printing of a logo or a serial number or any other distinctive sign on the dielectric strip, alongside the contact areas.

In addition, it is possible, in a method according to the invention, to attach the chip using the adhesive coated on the dielectric strip, and thus avoid an additional gluing step.

BRIEF DESCRIPTION OF THE DRAWINGS

Other particularities and advantages of the invention will emerge from a reading of the description given by way of illustrative and non-limitative example and made with reference to the accompanying figures, which depict:

FIG. 1, already described, is a diagram in transverse section illustrating a traditional method for manufacturing a smart card;

FIG. 2, already described, illustrates schematically the insetting of a micromodule according to a known method;

FIG. 3, already described, illustrates a method for manufacturing a smart card according to a technique of the prior art;

FIG. 4 is a diagram in transverse section of a first embodiment of the manufacturing method according to the present invention;

FIG. 5 is a diagram in transverse section of a second embodiment of the manufacturing method according to the present invention;

FIG. 6 is a diagram in transverse section of a third embodiment of the manufacturing method according to the present invention;

FIG. 7 illustrates schematically the insetting of a micromodule according to the method of the present invention;

FIG. 8 is a schematic view from below, on the assembly side, of the micromodule obtained by the method according to the invention;

FIG. 9 is a schematic view from above, on the contact side, of the micromodule obtained by the method according to the invention.

DESCRIPTION OF THE INVENTION

The manufacturing method according to the invention comprises the following steps:

A low-cost insulating material is supplied in strip form and coated with a single-face adhesive. The dielectric strip 60 can be obtained by cutting from a dielectric material to a predetermined width.

This dielectric 60 can consist of PET (polyethylene terephthalate), PEN (polyethylene nerephthalate), paper, ABS (acrylonitrile-butadiene-styrene), PVC (polyvinyl chloride) or any other known low-cost insulating material.

In parallel, a metallic grid 18 is produced based on a copper alloy, for example, and covered with an electrolytic deposition adapted to the type of connection which it is desired to produce, for example gold or nickel.

Contact 19a and connection 19b areas are defined in each conductive frame of the grid 18.

The grid 18 and the dielectric 60 are next fixed integrally, by lamination or by any other means.

The dielectric strip 60 is advantageously coated with an adhesive which is non-peelable, that is to say non-removable, at room temperature. This adhesive allows the integral fixing of the dielectric 60 and the metallic grid 18.

It may for example be an adhesive which can be cross-linked in an oven, activated following the lamination of the dielectric strip 60 on the grid 18.

The dielectric support film 60 is preferentially very fine so as to satisfy the ISO standard on the final thickness of the micromodule 100 obtained by the method of the invention.

According to a particular embodiment of the invention, the grid 18 is arched according to conventional methods, by means of punch for example.

The arch 80 on the metallic grid 18 is intended to at least partially encase the step of the thickness of the dielectric strip 60 so as to obtain a micromodule 100 which is practically flat on the same side as the ISO contacts.

Preferentially, the dielectric 60 will be flush with the contact areas 19a on the grid 19 whilst leaving the latter free so as to ensure communication from the circuit towards the outside.

In addition, the curvature 80 facilitates the lamination of the dielectric 60 on the grid 18 whilst constituting a guide for the dielectric strip.

The chip 10 is then glued.

In FIG. 4, the chip 10 is glued to the grid 18 at the pitch of the chosen pattern, with a glue which is conductive or otherwise.

In FIG. 5, the chip is glued directly to the dielectric 60. This gluing can be done hot, the adhesive of the dielectric strip 60 then being thermoactivatable, or cold on an adhesive at room temperature, known as "tack". According to the chips 10 used, the glue chosen will be conductive or not.

The chip 10 is then connected by hard wiring, the connection wires 17 connecting the pads 11 on the chip 10 to the connection areas 19b on the grid 18.

FIG. 6 illustrates a variant embodiment in which the chip 10 is connected to the connection areas 19b according to a method of the "flip chip" type, which designates a known technique in which the chip is turned over.

In the example illustrated, the chip 10 is connected to the metallic grid 18 by means of a glue 350 with anisotropic electric conduction which is well known and often used for mounting passive components on a surface. The output pads 11 of the chip 10 are placed opposite the connection areas 19b on the grid 18. This glue 350 in fact contains elastically deformable conductive particles which make it possible to establish electrical conduction along the axis z (that is to say along the thickness) when they are pressed between the output pads 11 and the connection areas 19b, whilst ensuring isolation in the other directions (x,y).

In a variant embodiment, the electrical connection between the chip 10 and the connection areas 19b can be improved by protrusions 12, made from hot-melt alloy of the Sn/Pb type or from conductive polymer, produced on the pads 11 on the chip 10.

After the attachment and connection of the chip 10 on the metallic grid 18, the micromodule 100 must be inset in the cavity in a card body.

It is advantageous, as already disclosed with reference to the prior art, to deposit, by lamination or any other means, an adhesive 25 which can be reactivated by heat or pressure over the entire useful width of the grid 18.

In the case of a connection of the chip 10 to the grid 18 by hard wiring, the adhesive 25 will previously have been perforated in order to leave the chip 10 and its connection wires 17 free.

If necessary, an encapsulation step protects the active face of the chip 10 and its connection wires 17 by depositing a resin 20 which coats the chip 10 and the wires 17.

Advantageously, the adhesive 25 can serve as a barrier limiting the spread of the protective resin 20.

In the case of a connection of the chip 10 to the grid 18 by a "flip chip" method, as described above, the adhesive 25 will be laminated over the entire surface of the grid 18 and will cover the rear face of the chip 10.

The micromodule 100 is then cut by means of a punch or a laser beam, for example, and then attached in the cavity of a card body by reactivating the adhesive 25 or by depositing a drop of glue of the cyanoacrylate type, for example, in the cavity.

FIG. 7 illustrates the step of insetting the micromodule 100 in the cavity 120 of the card body 110, by the technique of hot pressing in order to reactive the adhesive 25.

This figure shows clearly that the hot pressing is not applied to the dielectric 60, but solely to the metallic grid 18.

Likewise, if a technique of attaching with a glue of the cyanoacrylate type had been chosen, the glue would have been applied between the cavity 120 of the card body 110 and the metallic grid 18, covered or not with the reactivatable adhesive 25, and not to the dielectric 60.

Thus the invention makes it possible to dispense with a dielectric support film placed under the metallic grid, such a film necessarily being expensive because of the characteristics which it must have during the insetting of the micromodule.

The manufacturing method according to the invention compensates for the loss of mechanical rigidity by means of an ordinary dielectric support film disposed on the top of the grid and extending partially over the grid.

FIG. 8 is a schematic view from below, on the inside of the cavity of the card body, of the micromodule obtained by the method according to the invention.

The curvature 80 does indeed define the limit between the contact areas 19a and the connection areas 19b, only the latter being covered by the dielectric 60.

FIG. 9 is a schematic view from above, on the ISO contacts side, of the micromodule obtained by the method according to the invention.

Preferentially, the dielectric 60 is flush with the contact areas 19a on the metallic grid 18. The outside of the smart card thus obtained is therefore perfectly flat.

In addition, the connection terminal block 18 on the smart card has a middle zone corresponding to the dielectric 60 on which a logo or a drawing can be printed (preferentially directly during the cutting of the insulating material in a strip).

This side of the dielectric 60 can possibly be in different colours and/or bear the serial number of the card.

What is claimed is:

1. A method for manufacturing an electronic module with contacts, for a portable electronic device, comprising the steps of:

cropping or punching a continuous metallic grid with an external face and an internal face, the metallic grid being provided with contact areas as well as areas for connection to a chip;

supplying a low-cost dielectric support film;

producing a middle arched zone in the metallic grid between the contact areas;

non-removably fixing the dielectric support film on the external face of the arch, so as to at least partially encase the thickness of the dielectric support film and thereby obtain a module which is practically flat on the same side as the external face, to compensate for the loss of mechanical rigidity;

adhering the chip to the internal face of the grid and connecting the chip to said connection areas on the grid;

cutting out the module; and depositing a reactivable adhesive on the internal face of the grid.

2. A method according to claim 1, wherein the dielectric support film is obtained by cutting a strip from terephthalic polyethylene, nerephthalic polyethylene, paper, acrylonitrite-butadiene-styrene or polyvinyl chloride, coated with a single-face adhesive.

3. A method according to claim 1 wherein the low-cost dielectric support film is fixed flush with the contact areas, the fabricated module being completely flat.

4. A method according to claim 1, wherein the dielectric support film has an adhesive face which is non-peelable, to be fixed to the metallic grid.

5. A method according to claim 1, wherein the deposition of a reactivatable adhesive on the internal face of the grid is effected over the entire useful width of said grid by lamination.

6. A method according to claim 1, wherein, prior to the deposition on the grid of the reactivatable adhesive, the adhesive is perforated to allow the chip and connections to pass therethrough.

7. A method according to claim 6, wherein, following the perforation of the reactivatable adhesive, said adhesive serves as a barrier for limiting the spread of a resin during an encapsulation step which protects the chip and the connections by deposition of said resin.

8. A method according to claim 1 wherein the deposit of the reactivatable adhesive over the entire useful width of the internal face of said grid is laminated over the entire surface and covers the chip.

9. A method according to claim 1 wherein, after the step of deposition of adhesive and a step of encapsulation of the chip with resin or covering with an adhesive, the module is cut out by means of a punch or a laser beam.

10. A electronic module with contacts for go electronic chip support comprising;

a continuous metallic grid with an external face and an internal face, the metallic grid having contact areas as well as areas for connection to a chip, and a middle arched zone between said contact areas;

a low-cost dielectric support film fixed non-removably to the external face in the arched zone, so as to encase at least partially the thickness of the dielectric support film such that the module is practically flat on the side of the external face;

a chip adhered to the internal face of the grid and connected to said connection areas; and a deposit of a reactivable adhesive on the internal face of said grid.

11. A module according to claim 10, wherein the dielectric support film is obtained from terephthalic polyethylene, nerephthalic polyethylene, paper, acrylonitrile-butadiene-styrene or polyvinyl chloride, coated with a single-face adhesive.

12. A module according to claim 10 wherein the low-cost dielectric support film is flush wit the contact areas so that the module is completely flat.

13. A module according to claim 10 wherein the dielectric support film has an adhesive face which is non-peelable fixed to the metallic grid.

14. A module according to claim 10 wherein the deposit of the reactivable material on the internal face of the grid is laminated over the entire useful width of said grid.

15. A module according to claim 10 wherein the reactivable adhesive is perforated and allows the chip and connections to pass therethrough.

16. A module according to claim 15, wherein the perforation of the adhesive serves as a barrier for limiting the spread of an encapsulation resin which protects the chip and the connections.

17. A module according to claim 10 wherein the adhesive is disposed on the internal face over the entire useful width of the grid and covers the chip.

18. A module according to claim 17, wherein the chip has a front face with connection pads that face the metallic grid and are connected thereto, and the reactivable adhesive is laminated on the metallic grid and covers the rear face of the chip.

19. A method for manufacturing a portable electronic device comprising the steps of:

cropping or punching a continuous metallic grid with an external face and an internal face, the metallic grid being provided with contact areas as well as areas for connection to a chip;

supplying a low-cost dielectric support film;

producing a middle arched zone in the metallic grid between the contact areas;

non-removably fixing the dielectric support film on the external face of the arch, so as to at lest partially encase the thickness of the dielectric support film and thereby obtain a module which is practically flat on the same side as the external face, to compensate for the loss of mechanical rigidity;:

adhering the chip to the internal face or the grid and connecting the chip to said connection area on the grid;

cutting out the module;

depositing a reactivable adhesive on the internal face of the grid; and attaching the module it a cavity of a card body by activation of the adhesive.

20. A method according to claim 19, wherein an impression is made on the middle zone containing the dielectric film during a step of cutting out the 21. A portable electronic device including a module comprising:

a continuous metallic grid with an external face and an internal face, the metallic grid having contact areas as well as areas for connection to a chip, and a middle arched zone between said contact areas;

a low-cost dielectric support film fixed non-removably to the external face in the arched zone, so as to encase at least partially the thickness of the dielectric support film such that the module is practically flat on the side of the external face;

a chip adhered to the internal face of the grid and connected to said connection areas; and a deposit of a reactivable adhesive on the internal face of said grid;

and further including a terminal block which is practically flat with the connection grid; the middle zone corresponding to the dielectric film having an impression which is a logo or a design or the serial number of the electronic device.

* * * * *